United States Patent
Morin

(10) Patent No.: US 10,418,488 B2
(45) Date of Patent: Sep. 17, 2019

(54) METHOD TO FORM STRAINED CHANNEL IN THIN BOX SOI STRUCTURES BY ELASTIC STRAIN RELAXATION OF THE SUBSTRATE

(71) Applicant: STMICROELECTRONICS, INC., Coppell, TX (US)

(72) Inventor: Pierre Morin, Grenoble (FR)

(73) Assignee: STMicroelectronics, Inc., Coppell, TX (US)

(*) Notice: Subject to any disclaimer, the term of this patent is extended or adjusted under 35 U.S.C. 154(b) by 0 days.

(21) Appl. No.: 15/677,855

(22) Filed: Aug. 15, 2017

(65) Prior Publication Data
US 2017/0345935 A1 Nov. 30, 2017

Related U.S. Application Data

(62) Division of application No. 14/977,077, filed on Dec. 21, 2015, now Pat. No. 9,768,299, which is a division
(Continued)

(51) Int. Cl.
*H01L 29/78* (2006.01)
*H01L 29/66* (2006.01)
(Continued)

(52) U.S. Cl.
CPC .. *H01L 29/7848* (2013.01); *H01L 21/823814* (2013.01); *H01L 21/823821* (2013.01); *H01L 21/823878* (2013.01); *H01L 21/84* (2013.01); *H01L 21/845* (2013.01); *H01L 27/0924* (2013.01); *H01L 27/1203* (2013.01); *H01L 27/1211* (2013.01); *H01L 29/0653* (2013.01); *H01L 29/161* (2013.01);
(Continued)

(58) Field of Classification Search
None
See application file for complete search history.

(56) References Cited

U.S. PATENT DOCUMENTS 7,078,299 B2 7/2006 Maszara et al.
7,198,995 B2 4/2007 Chidambarrao et al.
(Continued)

FOREIGN PATENT DOCUMENTS

CN 1770470 A 5/2006

OTHER PUBLICATIONS

Tezuka et al., "Dislocation-free formation of relaxed SiGe-on-insulator layers," *Applied Physics Letters* 80:3560-3562, 2002.

*Primary Examiner* — Long Pham
(74) *Attorney, Agent, or Firm* — Seed Intellectual Property Law Group LLP

(57) ABSTRACT

Methods and structures for forming strained-channel FETs are described. A strain-inducing layer may be formed under stress in a silicon-on-insulator substrate below the insulator. Stress-relief cuts may be formed in the strain-inducing layer to relieve stress in the strain-inducing layer. The relief of stress can impart strain to an adjacent semiconductor layer. Strained-channel, fully-depleted SOI FETs and strained-channel finFETs may be formed from the adjacent semiconductor layer. The amount and type of strain may be controlled by etch depths and geometries of the stress-relief cuts and choice of materials for the strain-inducing layer.

24 Claims, 9 Drawing Sheets

Related U.S. Application Data of application No. 14/186,342, filed on Feb. 21, 2014, now Pat. No. 9,236,474.

(51) Int. Cl.

| | | |
|---|---|---|
| *H01L 27/12* | (2006.01) | |
| *H01L 21/8238* | (2006.01) | |
| *H01L 21/84* | (2006.01) | |
| *H01L 27/092* | (2006.01) | |
| *H01L 29/06* | (2006.01) | |
| *H01L 29/16* | (2006.01) | |
| *H01L 29/161* | (2006.01) | |
| *H01L 29/165* | (2006.01) | |
| *H01L 29/786* | (2006.01) | |

(52) U.S. Cl.
CPC ........ *H01L 29/165* (2013.01); *H01L 29/1608* (2013.01); *H01L 29/66772* (2013.01); *H01L 29/66795* (2013.01); *H01L 29/785* (2013.01); *H01L 29/7842* (2013.01); *H01L 29/7846* (2013.01); *H01L 29/7849* (2013.01); *H01L 29/78654* (2013.01)

(56) References Cited

U.S. PATENT DOCUMENTS

| | | |
|---|---|---|
| 7,851,313 B1 | 12/2010 | Luo et al. |
| 8,017,463 B2 | 9/2011 | Chang |
| 8,513,073 B1 | 8/2013 | Basker et al. |
| 8,716,156 B1 | 5/2014 | Pawlak et al. |
| 8,921,940 B2 | 12/2014 | Kim et al. |
| 9,034,723 B1 | 5/2015 | Shieh et al. |
| 9,236,474 B2 | 1/2016 | Morin et al. |
| 9,660,080 B2 | 5/2017 | Morin et al. |
| 9,660,081 B2 | 5/2017 | Morin et al. |
| 2006/0076625 A1 | 4/2006 | Lee et al. |
| 2006/0214225 A1* | 9/2006 | Holt .................. H01L 21/76254 257/347 |
| 2009/0321833 A1 | 12/2009 | Basker et al. |
| 2011/0147811 A1 | 6/2011 | Kavalieros et al. |
| 2011/0227165 A1 | 9/2011 | Basker et al. |
| 2011/0291188 A1 | 12/2011 | Cheng et al. |
| 2011/0291189 A1* | 12/2011 | Cheng .............. H01L 29/66772 257/347 |
| 2011/0309446 A1 | 12/2011 | Doris et al. |
| 2012/0070953 A1 | 3/2012 | Yu et al. |
| 2014/0134822 A1 | 5/2014 | Srinivasan et al. |
| 2014/0183633 A1 | 7/2014 | Chen et al. |
| 2014/0252469 A1 | 9/2014 | Lee et al. |
| 2014/0252483 A1 | 9/2014 | Nagumo |
| 2014/0268445 A1* | 9/2014 | Vemula ................ H03K 17/693 361/56 |
| 2014/0273378 A1 | 9/2014 | Rodder |
| 2014/0299936 A1 | 10/2014 | Zhang |
| 2014/0353760 A1 | 12/2014 | Loubet et al. |
| 2015/0028349 A1 | 1/2015 | Loubet et al. |
| 2015/0076514 A1 | 3/2015 | Morin et al. |
| 2015/0187941 A1* | 7/2015 | Zhou .................. H01L 29/1054 257/192 |
| 2015/0249153 A1 | 9/2015 | Morin et al. |
| 2015/0255457 A1 | 9/2015 | Loubet et al. |

* cited by examiner

FIG. 4C-1      FIG. 4C-2

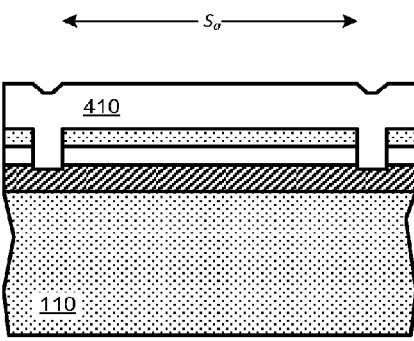
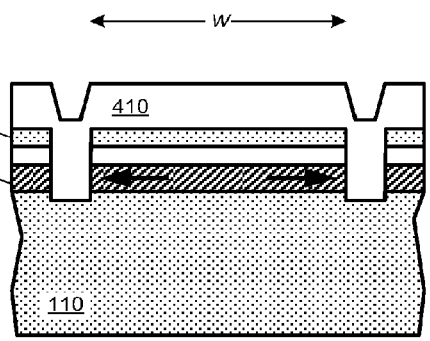
*FIG. 4D-1*    *FIG. 4D-2*
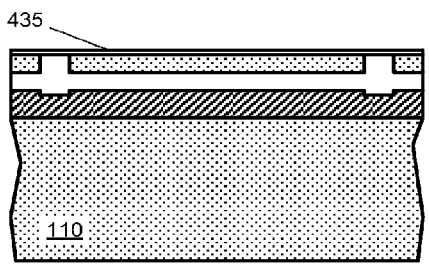
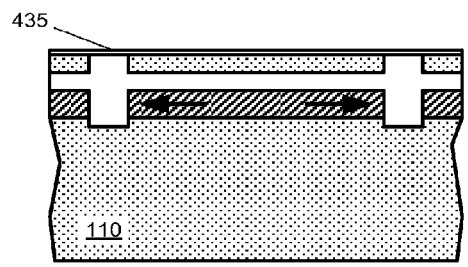
*FIG. 4E-1*    *FIG. 4E-2*
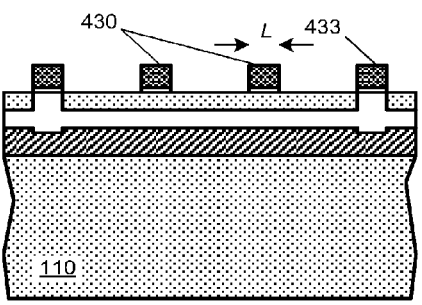
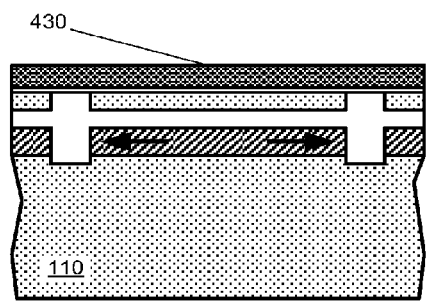
*FIG. 4F-1*    *FIG. 4F-2*

METHOD TO FORM STRAINED CHANNEL IN THIN BOX SOI STRUCTURES BY ELASTIC STRAIN RELAXATION OF THE SUBSTRATE

BACKGROUND

Technical Field

The technology relates to methods and structures for making strained-channel FETs.

Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and super-junction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed in a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

The second type of transistor is called a fully-depleted, silicon-on-insulator or "FD-SOI" FET. The channel, source, and drain of an FD-SOI FET is formed in a thin planar semiconductor layer that overlies a thin insulator. Because the semiconductor layer and the underlying insulator are thin, the body of the transistor (which lies below the thin insulator) can act as a second gate. The thin layer of semiconductor on insulator permits higher body biasing voltages that can boost performance. The thin insulator also reduces leakage current to the transistor's body region that would otherwise occur in bulk FET devices.

SUMMARY

The described technology relates to methods and structures for making strained-channel FD-SOI and strained-channel finFET devices. The channel regions of the devices may be strained by a strain-inducing layer that is formed below a thin insulating layer in the device. In some embodiments, the channel region may be strained uniaxially, whereas in other embodiments the channel region may be strained biaxially. Strain may be induced in the channel regions of FETs by forming stress-relief cuts or trenches in the strain-inducing layer. The stress-relief cuts release stress in the strain-inducing layer, allowing regions of the strain-inducing layer to relax (e.g., expand or compress). This relaxing can in turn impart stress to an adjacent semiconductor layer in which channel regions for FETs may be formed. The amount and type of strain may be determined by the orientation, pattern, and depth of the relief cuts and the choice of materials for the strain-inducing layer.

According to some embodiments, a strained-channel FET may comprise a source region, a drain region, and a channel region. The source, drain, and channel regions may be formed in a first semiconductor material. The strained-channel FET may further include a strain-inducing layer of a second semiconductor material extending laterally across an area of a substrate that includes the source, channel, and drain regions. The strain-inducing layer may be located adjacent the first semiconductor material, and may be formed on a substrate. The strained-channel FET may include at least one stress-relief trench formed in the strain-inducing layer and adjacent to or proximal to the strained-channel FET. The strain-inducing layer, after being cut, can relax and impart strain to at least the channel region of the strained-channel FET. The first semiconductor material may be the same as or different from the material of the bulk substrate, and may be different from the strain-inducing layer.

In some aspects, the source, drain, and channel regions are formed in an ultrathin semiconductor layer disposed on an ultrathin buried oxide layer. According to some implementations, the source, drain, and channel regions are formed in a semiconductor fin. In some implementations, the strain-inducing layer comprises SiGe or SiC and the source, drain, and channel regions are formed in Si. In some aspects, the thickness of the strain-inducing layer is between 10 nm and 100 nm and the thickness of the ultrathin semiconductor layer is between 1 nm and 25 nm.

In some aspects, the first semiconductor material comprises an epitaxial layer formed on a substrate having a second semiconductor material that is chemically different from the first semiconductor material. In some implementations, the first semiconductor material has a first lattice constant that differs from a second lattice constant in the second semiconductor material, wherein the difference in first and second lattice constants determine a stress in the strain-inducing layer prior to formation of the at least one stress-relief trench. In some implementations, the first semiconductor material is SiGe or SiC and the second semiconductor material is Si.

According to some aspects, a strained-channel FET may further comprise at least one epitaxial region formed on the drain and source regions that add strain to the channel region in addition to strain induced in the channel region by the strain-inducing layer. In some implementations, a strained-channel FET may comprise bias circuitry for applying a bias voltage to the second semiconductor material as a back gate or body bias.

In some aspects, a strained-channel FET may include a second FET located a distance from the at least one stress-relief trench, wherein a channel region of the second FET has substantially no strain. In some implementations, a channel type of the strained-channel FET is opposite a channel type of the second FET.

In some implementations of a strained-channel FET, at least one stress-relief trench comprises a first plurality of trenches extending in a first lateral direction and a second plurality of trenches extending in a second lateral direction that is different from the first lateral direction. In some aspects the first plurality of trenches and the second plurality of trenches are filled with an electrical insulator. The electrical insulator may exhibit compressive or tensile stress. In some aspects, the first plurality of trenches may extend through the strain-inducing layer and the second plurality of trenches do not extend through the strain-inducing layer. In some implementations, the first plurality of trenches and the second plurality of trenches extend through the strain-inducing layer. According to various the first plurality of trenches and the second plurality of trenches intersect to form a plurality of active areas that are electrically insulated.

In some implementations, the source, drain, and channel regions may be located in a first active area of a plurality of active areas, and the first active area may have a width W and a length $S_a$. According to some aspects, the length $S_a$ is selected to be larger than a critical length $S_{ac}$ such that the first active area exhibits uniaxial strain in the channel region, and wherein $S_{ac}$ is between four and six times a total thickness of the strain-inducing layer, a semiconductor layer in which the channel region is formed, and an insulating layer between the strain-inducing layer and the semiconductor layer. In some implementations, the length $S_a$ is selected to be less than a critical length $S_{ac}$ such that the first active area exhibits biaxial strain in the channel region, and wherein $S_{ac}$ is between four and six times a total thickness of the strain-inducing layer, a semiconductor layer in which the channel region is formed, and an insulating layer between the strain-inducing layer and the semiconductor layer.

The foregoing aspects and implementations may be used in any suitable combination in one or more described embodiments of strained-channel FET.

A method for forming at least one strained-channel FET may comprise obtaining a SOI substrate that includes a uniform strain-inducing layer under compressive or tensile stress extending over an area of the substrate. The SOI substrate may further include a semiconductor layer extending over the area and adjacent to the strain-inducing layer. In some embodiments, the SOI substrate may include an insulating layer between the semiconductor layer and strain-inducing layer. The method may further comprise forming stress-relief trenches in the strain-inducing layer to relieve stress in the strain-inducing layer, so as to impart strain to at least one active area in the semiconductor layer. Source, drain, and channel regions of FETs may be formed in the at least one active area.

According to some aspects, a method for forming at least one strained-channel FET may further comprise forming a gate structure in the at least one active area, and forming source, channel, and drain regions in the at least one active area. The source, channel, and drain regions may be formed in the semiconductor layer, and the semiconductor layer may be ultrathin and be disposed on an ultrathin buried oxide layer. In some implementations, a method may further comprise forming at least one epitaxial region on the drain and source regions that add strain to the channel region in addition to strain induced in the channel region by the strain-inducing layer. In some aspects, a method may comprise forming bias circuitry for applying a bias voltage to the substrate as a back gate or body bias.

In some implementations, a method for forming at least one strained-channel FET may comprise forming at least one semiconductor fin in the semiconductor layer, forming a gate structure over the at least one fin, and forming the source, drain, and channel regions in the semiconductor fin.

In some aspects, the strain-inducing layer may comprise an epitaxial layer formed on a bulk substrate having a first semiconductor material that is chemically different from the bulk substrate. In some implementations, the strain-inducing layer comprises SiGe or SiC and the source, drain, and channel regions are formed in Si. According to some embodiments, the first semiconductor material has a first lattice constant that differs from a second lattice constant in the second semiconductor material, wherein the difference in first and second lattice constants determine a stress in the strain-inducing layer prior to formation of the at least one stress-relief trench.

In some implementations, a method for forming at least one strained-channel FET may further comprise forming at least one first FET in the at least one active area, and forming at least one second FET located a distance from at least one of the stress-relief trenches, wherein a channel region of the at least one second FET has substantially no strain. In some aspects, a channel type of the at least one first FET is opposite a channel type of the at least one second FET.

According to some aspects, forming the stress-relief trenches comprises forming a first plurality of trenches extending in a first lateral direction, and forming a second plurality of trenches extending in a second lateral direction that is different from the first lateral direction. In some aspects, a method for forming at least one strained-channel FET may further comprise filling the first plurality of trenches and the second plurality of trenches with an electrical insulator. In some implementations, the electrical insulator may be formed in the trenches under compressive stress or under tensile stress. A method for forming at least one strained-channel FET may further comprise etching the first plurality of trenches through the strain-inducing layer, and etching the second plurality of trenches to a depth that does not extend through the strain-inducing layer. In some aspects, a method may comprise etching the first plurality of trenches and the second plurality of trenches through the strain-inducing layer. The first plurality of trenches and the second plurality of trenches may intersect to form the at least one electrically-insulated active area.

In some implementations, a method for forming at least one strained-channel FET may further comprise forming the stress-relief trenches to define a first active area of the at least one active area, the first active area having a width W and a length $S_a$, and forming source, drain, and channel regions in the first active area. In some aspects, a method may comprise selecting the length $S_a$ to be greater than four to six times a total thickness of the strain-inducing layer, the semiconductor layer, and an insulating layer between the strain-inducing layer and the semiconductor layer. In some aspects, a method may comprise selecting the length $S_a$ to be less than four to six times a total thickness of the strain-inducing layer, the semiconductor layer, and an insulating layer between the strain-inducing layer and the semiconductor layer.

The foregoing aspects and implementations may be combined in any suitable manner in a method for forming at least one strained-channel FET. Additionally, any of the foregoing embodiments of strained-channel FETs may be formed using one or more of the foregoing embodiments of methods for forming at least one strained-channel FET.

The foregoing and other aspects, implementations, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device or a few devices may be shown of a large plurality of devices that may be fabricated in parallel. The drawings are not intended to limit the scope of the present teachings in any way.

FIGS. 4A-4G depict process steps that may be used to form strained-channel FD-SOI FETs, according to various embodiments;

The features and advantages of the embodiments will become more apparent from the detailed description set forth below when taken in conjunction with the drawings.

DETAILED DESCRIPTION

Figure 1:
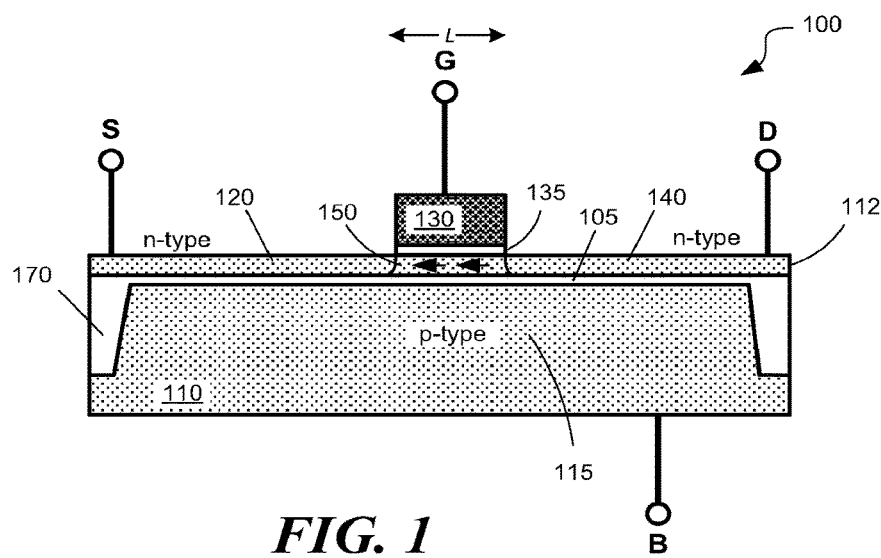
FIG. 1 is an elevation view depicting a FD-SOI FET, according to some embodiments.

An example of a fully-depleted silicon-on-insulator (FD-SOI) FET 100 is depicted in FIG. 1, according to some embodiments. The FD-SOI FET may comprise a source region 120, a gate structure 130, 135, a drain region 140, and a channel region 150. The source, channel region, and drain may be formed in a thin semiconductor layer 112 that is formed adjacent a thin insulating layer 105 or buried oxide layer 105. The thin insulating layer may be formed adjacent a substrate 110. In some embodiments, trench isolation structures 170 comprising electrically-insulating material may be formed around one or more FD-SOI FETs. The gate structure may comprise a gate conductor 130 and a thin gate insulator 135. According to some embodiments, integrated source S, gate G, drain D, and body B interconnects may be formed to provide electrical connections to the source, gate, drain, and back body regions of the FD-SOI FET.

In some embodiments, the source region 120 and drain region 140 of a FD-SOI FET may be doped with donor or acceptor impurities to form regions of a first conductivity type (e.g., n-type or p-type). The channel region 150 may be doped to be of an opposite conductivity type than that of the source and drain regions. In some implementations, the channel region 150 may be undoped. In some embodiments, the channel region may be of a same conductivity type as a back body region 115.

Figure 2A:
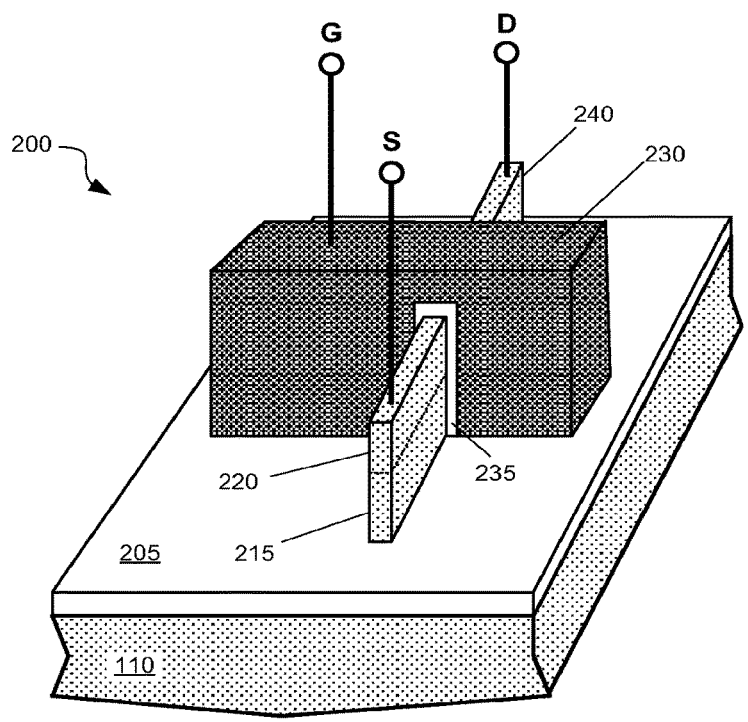
FIG. 2A is a perspective view depicting a finFET, according to some embodiments.

An example of a finFET 200 is depicted in the perspective view of FIG. 2A. A finFET may be fabricated on a bulk semiconductor substrate 110, e.g., a silicon substrate, and comprise a fin-like structure 215 that runs in a length direction along a surface of the substrate and extends in a height direction normal to the substrate surface. The fin 215 may have a narrow width, e.g., less than 50 nanometers. There may be an electrically-insulating layer 205, e.g., an oxide layer having a thickness up to 750 nm, on a surface of the substrate 110. The fin may pass through the insulating layer 205, but be attached to the semiconducting substrate 110 at a lower region of the fin. A gate structure comprising a conductive gate material 230 (e.g., polysilicon) and a gate insulator 235 (e.g., an oxide) may be fainted over a region of the fin. The finFET may further include a source region 220 and drain region 240 adjacent to the gate. A finFET may also include integrated source S, gate G, drain D, and body B (not shown) interconnects to provide electrical connections to the source, gate, drain, and back body regions of the device.

FinFETs like those depicted in FIG. 2A exhibit favorable electrostatic properties for scaling to high-density, low-power, integrated circuits. Because the fin and channel are raised from the substrate, the devices can exhibit reduced cross-coupling between proximal devices. For the device shown in FIG. 2A, the fin 215 may be formed from the bulk substrate 110 by an etching process, and is therefore attached to the substrate at a base region of the fin, a region occluded in the drawing by the adjacent insulator 205. The insulator 205 may be formed after the etching of the fin 215. Because the fin 215 is attached to the semiconductor substrate, leakage current and cross-coupling may occur via the base region of the fin.

Figure 2B:
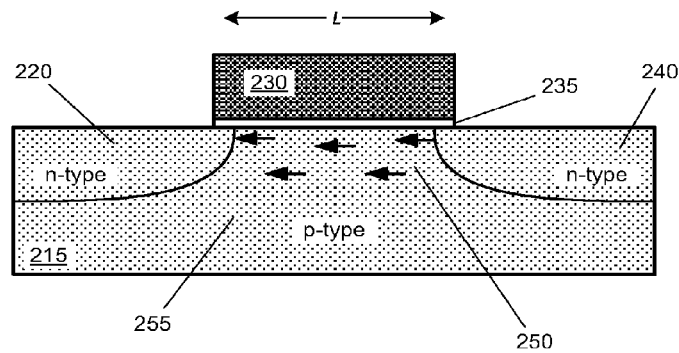
FIGS. 2B-2E depict cross-sectional views of finFET fins, according to various embodiments.
Figure 2C:
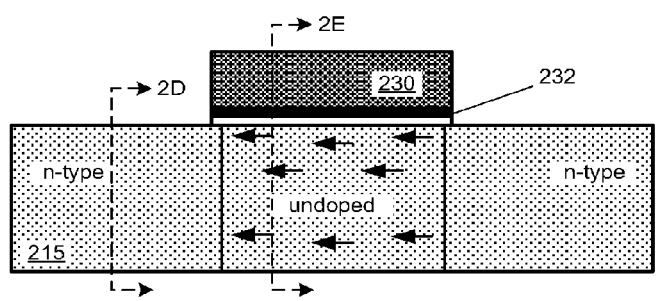

Source, channel, and drain regions of a finFET may be doped with donor or acceptor impurities to create different regions of different conductivity types, as depicted in FIGS. 2B-2C. According to some embodiments, source region 220 and drain region 240 may be doped to be of a first conductivity type and the channel region 250 may be doped to be of an opposite conductivity type, as depicted in FIG. 2B. The terms "source region" and "drain region" as used may include extension regions of the fins that lie between source and drain contact regions and the channel region of the finFET device or an FD-SOI device.

Figure 2D:
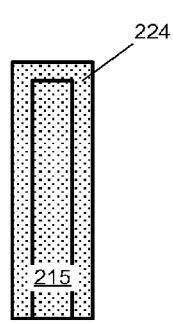

The finFET may further include a body region 255 that may be of a same conductivity type as the channel region in some implementations. In some embodiments, a channel region 250 of a finFET may be undoped, as depicted in FIG. 2C. The doping of source and drain regions in a finFET may be of various geometries. As depicted in FIG. 2B, vertical portions of the fin 215 may be doped to form source 220 and drain 240 regions. Alternatively, outer sheath portions 224 of a fin 215 may be doped to form source and drain regions, as depicted in FIGS. 2C-2E.

Figure 2E:
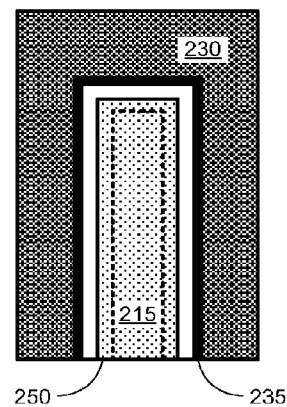

FIG. 2C and FIG. 2E depict a three-dimensional nature of a channel region 250 in a finFET, according to some embodiments. In some embodiments, the entire fin portion encased by the gate structure may be inverted and form a bulk channel rather than a surface channel. A metallic film 232 may be deposited between a gate electrode 230 and gate oxide 235 in some implementations to improve gate conductance and gate switching speeds.

The inventors have conceived of methods and devices for further improving FD-SOI FET and finFET performances. In various embodiments, channel regions of FD-SOI FETs and finFETs may be elastically strained by a strain-inducing layer that is incorporated in a substrate on which the finFETs or FD-SOI FETs are formed. According to some embodiments, the strain-inducing layer is formed under stress and a semiconductor layer in which a FET will be formed is disposed adjacent the strain-inducing layer. Stress-relief cuts may be formed in the strain-inducing layer to relieve stress in that layer. The relief of stress allows regions of the strain-inducing layer to relax, which can induce strain in the nearby semiconductor layer and thereby provide strained channel regions of FETs formed in the semiconductor layer.

The induced strain may improve the mobility of carriers in the channel regions, and thereby improve device speed. For example, compressive straining of silicon (Si) can improve the hole mobility within silicon. Tensile straining of Si can improve electron mobility. When enough strain is applied, the performance of silicon-based transistor devices can approach or even surpass the performance of devices based on compound semiconductors (e.g., SiGe, SiC, GaAs, InP, InGaAs, GaN, AlGaAs, etc.), which may require more difficult and expensive processing techniques.

Figure 3A:
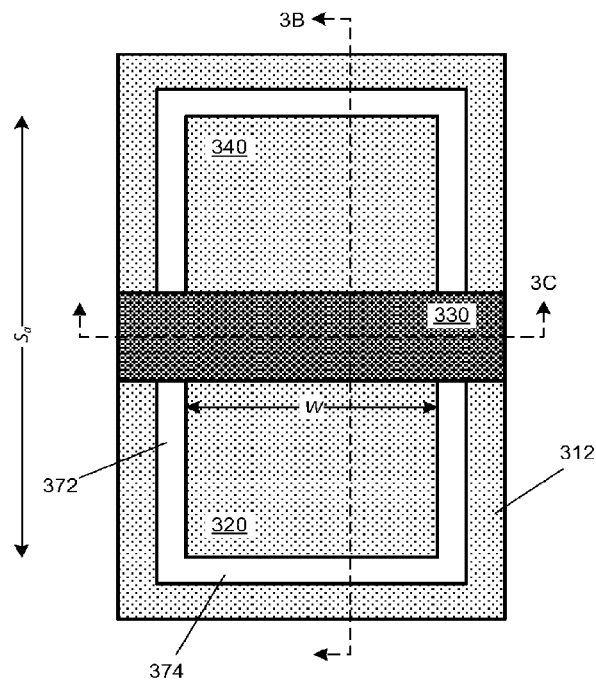
FIG. 3A is a plan view depicting a strained-channel FD-SOI FET, according to some embodiments.
Figure 3B:
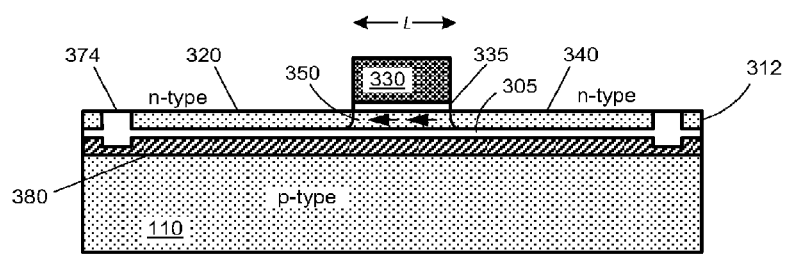
FIGS. 3B-3C depict cross-sectional views of a strained-channel FD-SOI FET, according to some embodiments.
Figure 3C:
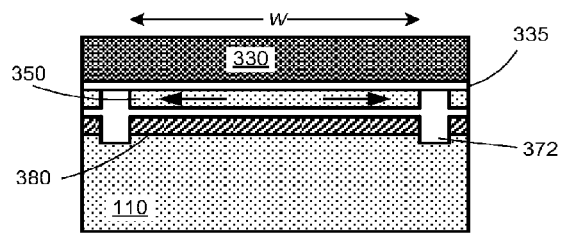

FIGS. 3A-3C depict a FD-SOI FET in which a channel region 350 is uniaxially strained along a channel width W direction. The strained-channel FD-SOI FET may include at least one gate structure that comprises a gate conductor 330 and thin gate oxide 335 formed on an active region of a thin semiconductor layer 312. The active region may include at least one source region 320 and at least one drain 340 region of a first conductivity type (e.g., n-type or p-type). The active region may have a length $S_a$. Adjacent a gate structure may be a channel region 350, which may be of an opposite conductivity type than the source and drain regions, or may be undoped. The semiconductor layer 312 may be formed adjacent a thin insulating layer 305. Adjacent the thin insulating layer 305 may be a semiconducting substrate 110 that includes at least one layer of strain-inducing material 380. Trench isolation structures 372, 374 may be formed around one or more FD-SOI FETs. In some embodiments, multiple FETs may be formed within an active region surrounded by trench isolation structures. According to some embodiments, the FD-SOI FET depicted in FIG. 3A may comprise an ultra-thin body and buried oxide (UTBB) structure.

The term "adjacent" may be used herein to describe structures that are proximal to one another, and that may or may not be in direct physical contact with one another. In some cases, e.g., when referring to layers of materials, there may be one or more thin layers between two adjacent layers.

As depicted in FIGS. 3B-3C, a strain-inducing layer 380 may be formed on a substrate 110 adjacent a semiconductor layer that contains a channel region 350, and may be patterned using lithographic etching techniques to impart strain to the channel region. The strain-inducing layer 380 may be formed of a first semiconductor material that is chemically different than the substrate 110. For example, the strain-inducing layer 380 may be formed of SiGe or SiC, and the substrate 110 may be a bulk Si substrate, though other material combinations may be used in other embodiments. The strain-inducing layer 380 may be epitaxially grown on the substrate, and there may be a lattice constant mismatch between the substrate material and the material of the strain-inducing layer 380. Because of the lattice mismatch, the strain-inducing layer 380 may form under stress, e.g., either compressive stress or tensile stress depending on the choice of materials.

The adjacent layers of material, e.g., thin insulator layer 305 and thin semiconductor layer 312, may be formed under low or no-stress conditions. According to some embodiments, the insulator may provide a buffer layer, so that the thin semiconductor layer 312 is formed on the substrate under low or no stress. Subsequent stress-relief cuts that extend through the strain-inducing layer 380 may allow local relaxation of the strain-inducing layer 380, which can impart stress to the adjacent thin insulator layer 305 and thin semiconductor layer 312. A stress-relief cut may be used to form a trench-isolation structure 372, for example, as depicted in FIG. 3C. For the embodiment shown in FIGS. 3A-3C, uniaxial tensile strain (indicated by the arrows in FIG. 3C) is imparted to the source, channel, and drain regions of the semiconductor layer 312 in a direction of the channel width W. The imparted strain is substantially uniaxial in the illustrated embodiment, because the trench cuts for the trench isolation structures 374 do not extend through the strain-inducing layer 380, as can be seen in FIG. 3B. Other embodiments may include stress-relief cuts formed in other patterns (e.g., polygons other than rectangular, circles, ovals, etc.) and at various selected etch depths so as to impart a desired type and amount of strain.

In some embodiments, at least one stress-relief cut extends through the strain-inducing layer 380 proximal a FD-SOI FET or a finFET. In some implementations, there may be multiple stress-relief cuts surrounding at least one FD-SOI FET or finFET that extend through the strain-inducing layer 380, so as to produce biaxial strain, radial strain, or multi-directional strain in an active area of the one or more devices. Although FIGS. 3A-3B depict a single FD-SOI FET within an area bounded by stress-relief cuts 372, there may be multiple FETs within an area bounded by stress-relief cuts or in an area adjacent a stress-relief cut.

In the case of the FD-SOI FET depicted in FIGS. 3A-3C, the strain-inducing layer 380 may, in some embodiments, include crystal defects, since it is separated from the semiconductor layer 312 (in which the source, channel, and drain regions may be formed) by the intervening oxide layer. Defects in the strain-inducing layer 380 may not propagate to the semiconductor layer 312. Similarly, a strain-inducing layer may include defects for fully-insulated, or insulated-all-around, finFETs.

In some embodiments, the thickness of the strain-inducing layer and impurity concentration may be controlled to limit in-plane stress of the strain-inducing layer to an elastic limit such that substantially no crystal defects, or a tolerable defect concentration, occurs. According to some embodiments, parameters of the strain-inducing layer 380 (e.g., thickness, impurity concentration) may be selected to yield a strain-inducing layer that has a low or tolerable concentration of defects. In some embodiments, the strain-inducing layer 380 may be formed such that the stress within that layer is substantially only elastic. According to some embodiments, the density of defects in the strain-inducing layer 380 may be between 1 and 10 defects/cm$^2$, or may be between 1 and 100 defects/cm$^2$ in other embodiments. In some implementations, the density of defects may be less than about $10^5$ defects/cm$^2$ in some embodiments, less than $10^4$ defects/cm$^2$ in some embodiments, less than $10^3$ defects/cm$^2$ in some embodiments, less than $10^2$ defects/cm$^2$ in some embodiments, and yet less than less than 10 defects/cm$^2$ in some embodiments.

In some embodiments, the thickness of the strain-inducing layer 380 may be greater than 50 nm and the concentration of impurities greater than 25%, such that a large amount of in-plane stress is formed during epitaxy and crystal defects occur due to some plastic relaxation of the strain-inducing layer. For example, a higher level of defects in the strain-inducing layer 380 may be tolerated, since the strain-inducing layer is separated from the semiconductor layer 312 by an insulating buffer 305. For example, the defect density may be as much as $10^6$ defects/cm$^2$ in some embodiments, as much as $10^8$ defects/cm$^2$ in some embodiments, and as much as $10^{10}$ defects/cm$^2$ in some embodiments. In some implementations, the defect density may be greater than $10^{10}$ defects/cm$^2$.

FIGS. 4A-4G illustrate structures corresponding to various method steps associated with forming strained-channel FD-SOI FETs and finFETs. According to some embodiments, a multi-layer, silicon-on-insulator (SOI) substrate may be formed, or provided, that comprises a bulk semiconductor substrate 110 of a first chemical composition, a strain-inducing layer 380, an insulating layer 305, and a semiconductor layer 312. The SOI substrate may be formed, in some embodiments, by wafer bonding. For example, the semiconductor layer 312 may be formed by bonding a second semiconductor substrate to at least the substrate 110 and strain-inducing layer 380. The second semiconductor substrate may or may not have the thin insulating layer 305 on its surface. After bonding, the second semiconductor substrate may be thinned to yield the thin semiconductor layer 312. The thinning may be done by chemical-mechanical polishing (CMP) in some embodiments. In some implementations, the insulating layer 305 may be formed after bonding, e.g., by ion implantation, thermal heating and annealing.

Strain-inducing layer 380 may comprise a chemical composition different from that of substrate 110. For example, strain-inducing layer 380 may be a compound semiconductor (e.g., SiGe, SiC, GaN, GaAs, etc.) or bulk semiconductor (e.g., Si, Ge, etc.) whereas substrate 110 may be a bulk semiconductor or compound semiconductor of a different composition. In various embodiments, there may be a mismatch in lattice or other physical parameters between the strain-inducing layer 380 and substrate 110 such that the strain-inducing layer 380 forms on the substrate 110 under stress (compressive or tensile).

The materials may be selected for substrate 110 and strain-inducing layer 380, so as to yield a desired type of stress in the strain-inducing layer 380. For example, Si may be selected for the substrate 110 and SiGe may be selected for the strain-inducing layer 380, so as to obtain a compressively-stressed, strain-inducing layer 380. Compressive stress may be desired in the strain-inducing layer 380 to impart tensile stress to a Si semiconductor layer 312 when the predominant type of transistor formed from the semiconductor layer is an n-channel device. Tensile stress in a channel region of an n-channel, silicon transistor can improve electron mobility. A material combination that produces tensile stress in strain-inducing layer 380 may be selected when the predominant type of transistor formed in a Si semiconductor layer 312 is a p-channel device. The type of strain desired may depend upon the material used for the channel region. For some materials, an n-channel device may benefit from compressive stress in the channel region.

The strain-inducing layer 380 may be formed by epitaxial growth (e.g., vapor phase epitaxy, or atomic layer deposition) on substrate 110 according to some embodiments, though other suitable processes may be used. Alternatively, the strain-inducing layer may be deposited by a physical deposition process such as, but not limited to, plasma deposition. During formation, an impurity species or straining dopant may be added to a chemical that would otherwise be used to form an epitaxial layer of a same type as the substrate 110. For example, Ge may be added as a straining dopant to a chemical that would otherwise be used to epitaxially grow a Si layer. The amount of strain in the strain-inducing layer 380 may be controlled by selecting an impurity concentration for the final epitaxial layer and a thickness of the layer. For example, the strain-inducing layer 380 may comprise a percentage of impurity having a value between about 5% and about 50%, in some embodiments. The impurity concentration may be by weight or by mole fraction. The thickness of the strain-inducing layer may be a value between about 5 nm and about 200 nm according to some embodiments, and between about 10 nm and about 100 nm in some embodiments.

The insulating layer 305 may comprise a thin oxide layer, e.g., a silicon oxide layer, though other insulators may be used in other embodiments. Any suitable electrical insulating material may be used for the insulating layer 305 that can withstand thermal processing parameters and that will not crack, buckle, or significantly deform upon subsequent formation of the semiconductor layer 312. The insulating layer 305 may be formed by an oxidation process in some embodiments, by a physical deposition in some embodiments (e.g., sputtering or evaporation or ion implantation), or by a chemical deposition process in some embodiments (e.g., chemical vapor deposition). The thickness of the insulating layer 305 may be approximately equal to or less than the thickness of the strain-inducing layer 380. In some embodiments, the thickness of the insulating layer 305 may be less than about 75% of the thickness of the strain-inducing layer 380, less than about 50% of the thickness of the strain-inducing layer 380 in some implementations, less than about 25% of the thickness of the strain-inducing layer 380 in some implementations, and yet less than about 10% of the thickness of the strain-inducing layer 380 in some embodiments. In some embodiments, the insulating layer 305 may be an ultrathin insulating layer having a thickness between about 1 nm and about 40 nm. The insulating layer 305 may have a Young's modulus that is less than a Young's modulus of the strain-inducing layer.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

The semiconductor layer 312 may have a thickness that is greater than, equal to, or less than the thickness of the strain-inducing layer 380. In some embodiments, the semiconductor layer 312 may be an ultra-thin layer for FD-SOI FET fabrication. For example, the semiconductor layer may be between about 1 nm and about 25 nm thick in some embodiments, and between about 1 nm and about 10 nm thick in some implementations. In other embodiments, the thickness of the semiconductor layer 312 may be between about 10 nm and about 100 nm for finFET fabrication.

According to one example, that is not intended to limit the invention in any way, the strain-inducing layer 380 may comprise SiGe and the substrate 110 may be Si. The concentration of Ge in the SiGe layer may be about 25%, and the thickness of the strain-inducing layer 380 may be about 30 nm. The insulating layer may comprise silicon oxide and be between about 10 nm and about 20 nm thick. The semiconductor layer 312 may be a Si layer that is about 5 nm thick. This stack of layers may be used for fabricating strained-channel FD-SOI nFETs, according to some embodiments. The total thickness T of this stack of layers may be between about 40 nm and about 60 nm, according to some embodiments.

Figure 4A:
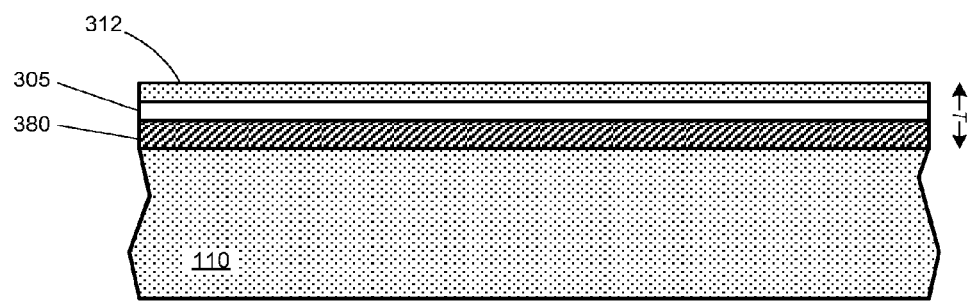
Figures 1, 4B:
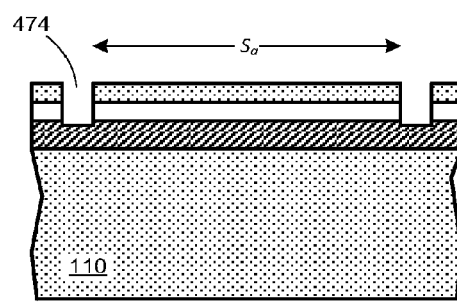
Figures 2, 4B:
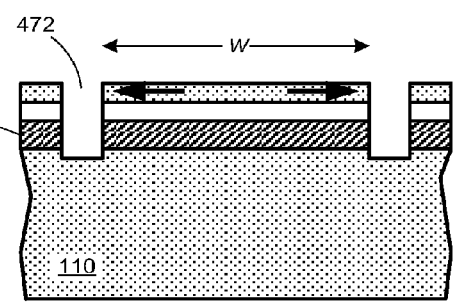
Figures 3, 4B:
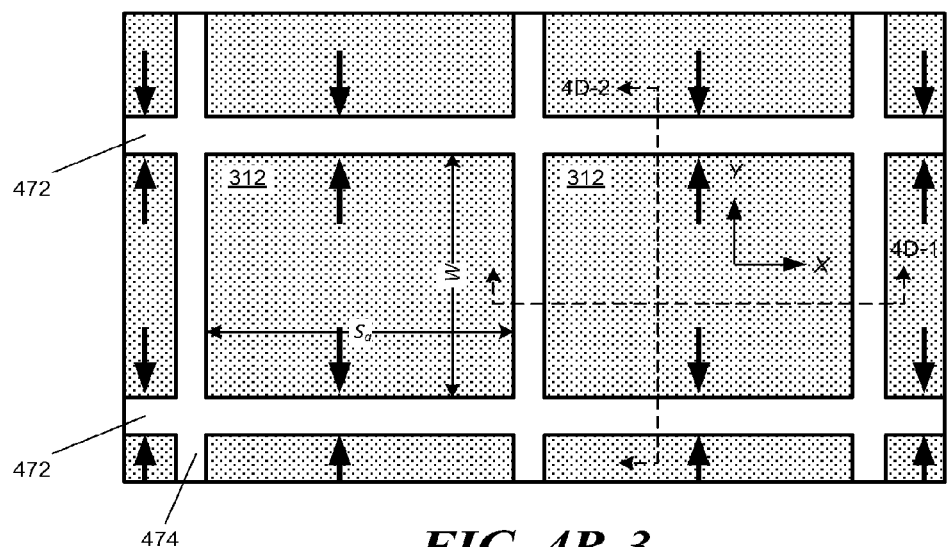

FIGS. 4B-1-4B-3 depict the formation of stress-relief cuts or trenches that provide uniaxial strain in regions of the semiconductor layer 312, according to some embodiments.

As depicted in FIGS. 4B-1 and 4B-3, first trenches 474 may be formed along a first direction (Y-direction) of the substrate surface. The first trenches 474 may be formed by first patterning a first resist (not shown) above the semiconductor layer 312, and etching into the SOI substrate through openings formed in the resist. The etch may be an anisotropic dry etch, e.g., a reactive ion etch. The first resist may comprise a soft resist (e.g., a polymer photoresist), a hard mask (e.g., a patterned nitride layer), or may be a multi-layer resist that includes both a soft resist and a hard mask. The first resist may be removed, and a second resist deposited and patterned for etching second trenches 472, according to some embodiments. In other embodiments, the first resist may be patterned and used to etch both trenches 474, 472 to a same etch depth.

In order to induce uniaxial strain in the regions of the semiconductor layer 312, the second trenches 472 may be etched through the strain-inducing layer 380, whereas the first trenches 474 are not etched through the strain-inducing layer 380. In some embodiments, the second trenches may be over-etched into the substrate 110, as depicted. The over-etch may be a distance between about 5 nm and about 50 nm, in some embodiments. In some implementations, the over-etch may be a distance between about 5 nm and about 250 nm. For example, a deeper etch and trench that is subsequently filled with insulating material may provide better electrical insulation between different devices in different regions separated by the trench. In some embodiments, the second trenches 472 may stop essentially at the interface between the substrate 110 and strain-inducing layer 380, e.g., within about 5 nm beyond the interface. Because the second trenches 472 extend through the strain-inducing layer 380 and the first trenches 474 do not, the strain in the strain-inducing layer is relieved in one direction, indicated as a Y-direction in FIG. 4B-3. The relief of the strain in the strain-inducing layer 380 induces uniaxial tensile strain in the semiconductor layer 312, as indicated by the bold arrows.

Figure 4C:
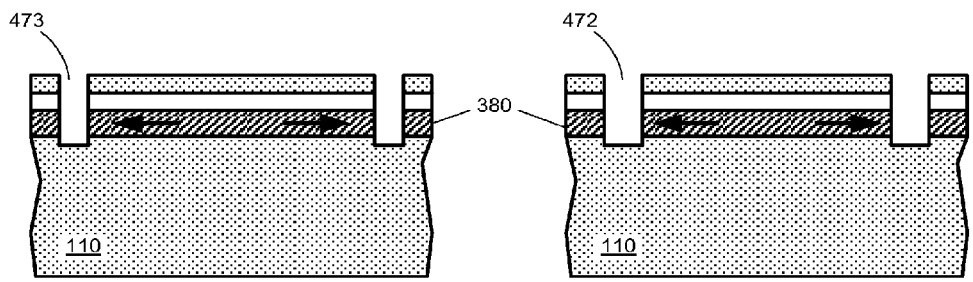
Figure 3:
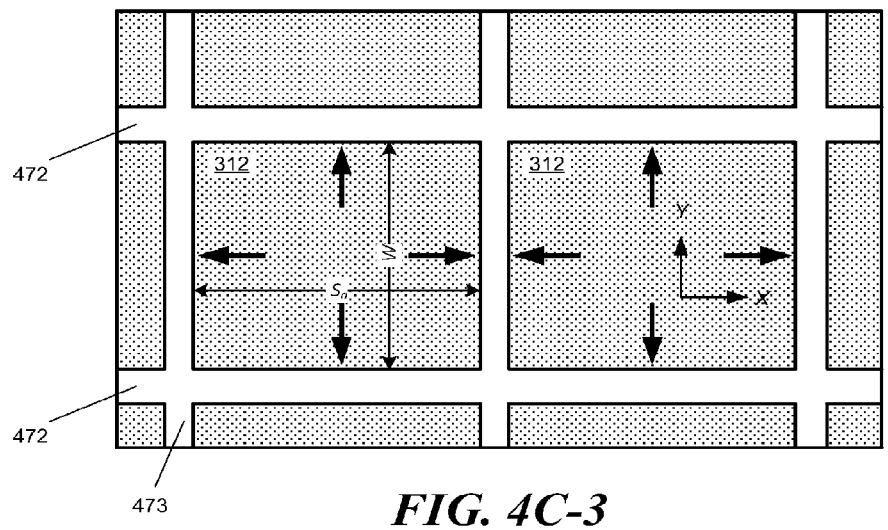

In some implementations, biaxial strain may be produced in semiconductor layer 312, as depicted in FIGS. 4C-1-4C-3. To produce biaxial strain, first trenches 473 and second trenches 472 may be etched to substantially a same depth through the strain-inducing layer 380. In such an implementation, a same resist mask may be used to form trenches 473 and trenches 472.

After formation of trenches 474, 473, 472 an insulator 410 may be deposited on the SOI substrate, as depicted in FIG. 4D-1 and FIG. 4D-2. FIG. 4D-1 depicts a cross-sectional view of a portion of the substrate shown in FIG. 4B-3, looking in the Y direction. FIG. 4D-2 depicts a cross-sectional view of a portion of the substrate shown in FIG. 4B-3, looking in the X direction. The insulator 410 provides electrical insulation and may be of a same type of material as insulating layer 305, or may be of a different material. Insulator 410 may be deposited by a deposition process that is different from, or the same as, the process used to form insulating layer 305. Insulator 410 may be deposited to fill the trenches 474, 473, 472, according to some embodiments. Insulator 410 may further cover a surface of the SOI substrate, as depicted in FIG. 4D-1 and FIG. 4D-2.

According to some embodiments, the deposited insulator 410 may be silicon oxide that is deposited by a plasma deposition process which includes an ozone gas, e.g., a TEOS/ozone deposition process. The inclusion of the ozone gas may provide an insulating film that exhibits tensile stress. In some implementations, the amount of ozone gas may be controlled or omitted for a deposition process, so as to determine an amount and type of stress in the deposited oxide. For example, ozone may be omitted in some embodiments to form an insulator in the trenches that exhibits compressive stress. In some embodiments, the amount of ozone may be controlled to yield an insulator that has substantially no stress.

The SOI substrate may be planarized after deposition of the insulator 410. In some embodiments, substrate planarization may be performed by a chemical-mechanical polishing (CMP) process that substantially stops at the semiconductor layer 312. In some embodiments, the CMP process may remove a small amount of the semiconductor layer 312. A gate insulator 435 may then be formed over the semiconductor layer 312, as depicted in FIG. 4E-1 and FIG. 4E-2.

The gate insulator 435 may be any suitable insulator that is used for insulating a gate electrode of a field-effect transistor from a channel region of the transistor. In some implementations, the gate insulator 435 comprises a thin thermal oxide, or a suitable high-dielectric constant material. The thickness of the gate insulator may have a value between about 0.2 nm and 10 nm.

Figures 3, 4F:
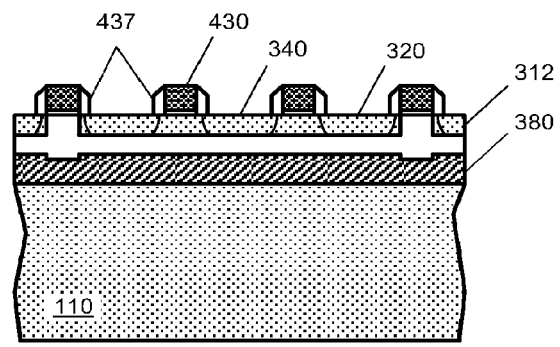

Gate electrodes 430, depicted in FIGS. 4F-1 and 4F-2, may be formed over the gate insulator 435 using any suitable lithographic process. In some embodiments, a mandrel or sidewall image transfer (SIT) process may be used to pattern a resist for etching the gate electrodes. A sidewall image transfer process may be referred to as self-aligned double patterning (SADP) in some cases. In some implementations, fins may be formed using a double patterning process, e.g., resist-on-resist patterning techniques (which may include a lithography-etch-lithography-etch (LELE) process or a lithography-freeze-lithography-etch (LFLE) process). In some implementations, the gate electrodes may be formed by interferometric lithography, imprint lithography, photolithography, extreme ultraviolet lithography, or x-ray lithography.

The gate electrodes 430 may be etched from a thin layer of conductive material, e.g., polysilicon, a metal, or a metallic composition. Because of the lithography process used, there may be "dummy" gates 433 disposed on the substrate. For example, at very fine feature sizes it can be easier to pattern a periodic array of narrow lines than isolated or randomly-spaced lines. Some of the lines in the periodic array may not align within an active area of the semiconductor layer 312 and may overlap or fall within a trench isolation structure. The dummy gates 433 need not be aligned with the insulating regions. In some embodiments, electrical contacts are not made to the dummy gates.

According to some embodiments, a length L of the gate electrodes may be between 5 nm and 50 nm. The length L of the gate electrode approximately determines the channel length of the transistor. There may be one or several gate structures formed at an active area of the semiconductor layer 312. FIG. 4F-1 depicts two gate structures formed at an active area of the semiconductor layer 312, and two dummy gates formed over insulating regions. The width of the gate structures may be less than, equal to, or greater than a width W of the active area. FIG. 4F-2 depicts a gate structure that extends beyond an active area, e.g., extending over the trench isolation structures into adjacent active areas.

Spacer structures 437 may be formed adjacent the gate electrodes 430, as depicted in FIG. 4F-3, using any suitable spacer forming process. In some embodiments, spacer structures may be formed by depositing a conformal film of silicon nitride, or other suitable material, over the surfaces of the gate electrodes and semiconductor layer 312. The silicon nitride may then be anisotropically etched to remove thin regions of the film from the upper surfaces of the gate electrodes 430 and from the surfaces of the semiconductor layer 312. Regions of the nitride film may remain on the edges of the gate electrodes, since an anisotropic etch may not etch through the vertical length of the sidewall coating. The gate electrode and spacers may provide self-aligned masks for subsequent doping of the source 320 and drain 340 regions of the transistor. In some embodiments of FD-SOI transistors, a source region and/or drain region may be shared by two adjacent transistors.

Figure 4G:
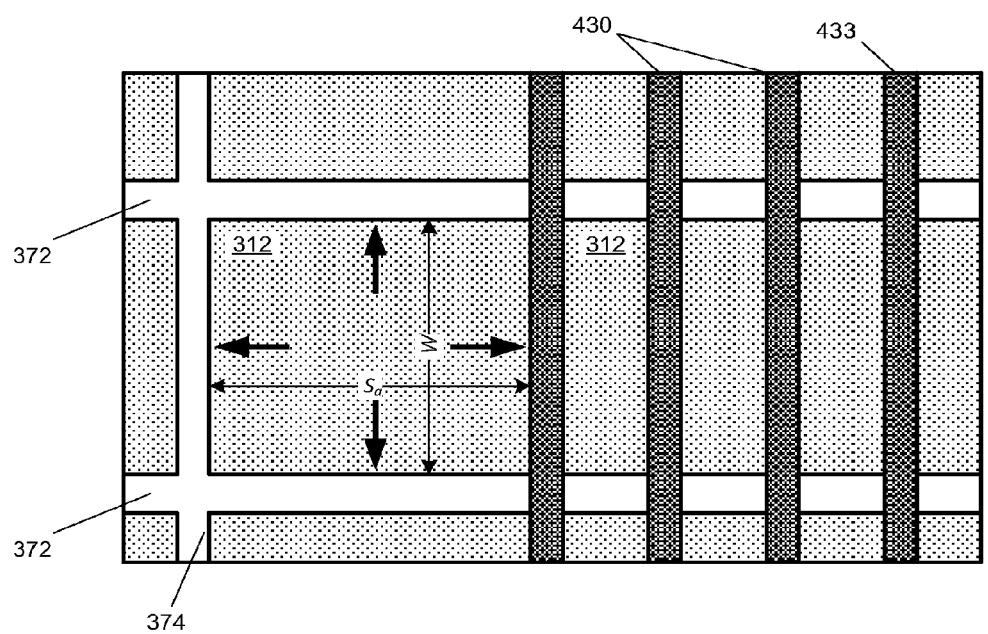

FIG. 4G depicts a plan view of a region of a biaxially strained substrate that includes gate electrodes 430. The spacer structures are not shown to simplify the drawing. According to some embodiments, gate electrodes may be formed to extend across several regions of strained semiconductor, e.g. extend across the insulating trenches 372, 374. In some implementations, gate electrodes may not extend across insulating trenches, and may be formed within isolated areas of active regions of the semiconductor layer 312. In some implementations, there may be regions of the substrate in which no gate electrodes are formed.

Electrical connections to the transistors may be formed using insulated metallization levels that may include pads for externally contacting to the circuits. For example, a first metallization level may include interconnects that contact at least one source region of a transistor or group of transistors. A second metallization level may include interconnects that contact at least one drain region of a transistor or group of transistors. A third metallization level may include interconnects that contact at least one gate electrode of a transistor or group of transistors. A fourth metallization level may include interconnects that contact at least one back gate or substrate region 110 of a transistor or group of transistors. A particular connection, e.g., a drain connection, may be made to contact the drain regions of a plurality of transistors and shared by the plurality of transistors, in some embodiments.

In some embodiments, the substrate 110 and strain-inducing layer 380 may include electrically insulating structures similar to insulating structures 372, 374 that divides the substrate and strain-inducing layer into separate, electrically-insulated regions. For example, the substrate 110 may be thinned, and trenches etched through the thinned substrate to the insulating layer 305. The trenches may then be filled with an electrically insulating material. These separate regions of the substrate 110 may be biased to different bias voltages via biasing circuitry. Back biasing of a transistor or group of transistors may be used to alter a threshold voltage, so as to reduce power consumption of the transistor or group. Back biasing may also be used to increase speed of a transistor or group. For example, the back biasing may be implemented as a second gate signal.

Figure 5:
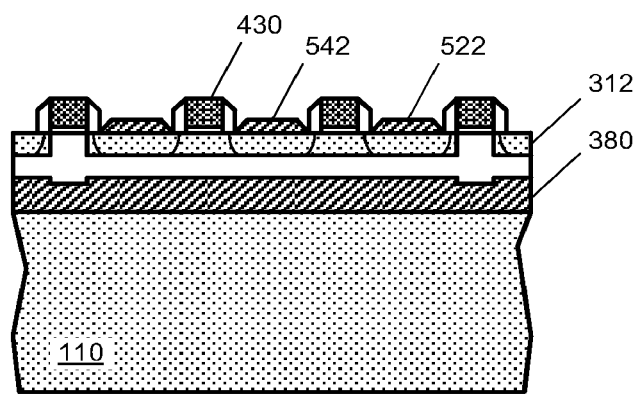
FIG. 5 depicts strained channel FD-SOI FETs having raised source and drain structures.

FIG. 5 depicts an embodiment of FD-SOI FETs that include raised source structures 522 and raised drain structures 542. According to some embodiments, raised source and drain structures may be formed by epitaxial growth on exposed semiconductor at the source and drain regions. The raised source and drain structures may be formed of a material that has the same composition as the semiconductor layer 312, in some embodiments. When formed of the same composition, the raised source structures 522 and raised drain structures 542 may not contribute any significant strain to the semiconductor layer 312. In other embodiments, the raised source and drain structures may be formed of a material that has a different composition than the semiconductor layer 312. When formed of a different composition, the raised source and drain structures may further strain the adjacent semiconductor layer 312 and add to the strain of the transistors' channel regions. For example, a raised source and drain structure that forms with compressive stress may increase tensile stress in a channel width direction (Y direction) and decrease tensile stress in a channel length direction (X direction). Conversely, a raised source and drain structure that forms with tensile stress may decrease tensile stress in a channel width direction (Y direction) and increase tensile stress in a channel length direction (X direction). Source and drain epitaxy to add stress may also be used for finFET devices.

The thickness of the raised source and drain regions may be any value between about 5 nm and about 100 nm. In some embodiments, donor or acceptor dopants may be added to the raised source and drain structures during their formation (e.g., during epitaxial growth). The dopants may be used to improve source and drain contacts, and may be used to dope the source and drain regions of the transistors, e.g., driven into the source and drain regions by a subsequent thermal processing step. External connections to the source and drain regions may be made to the raised structures.

Figure 6:
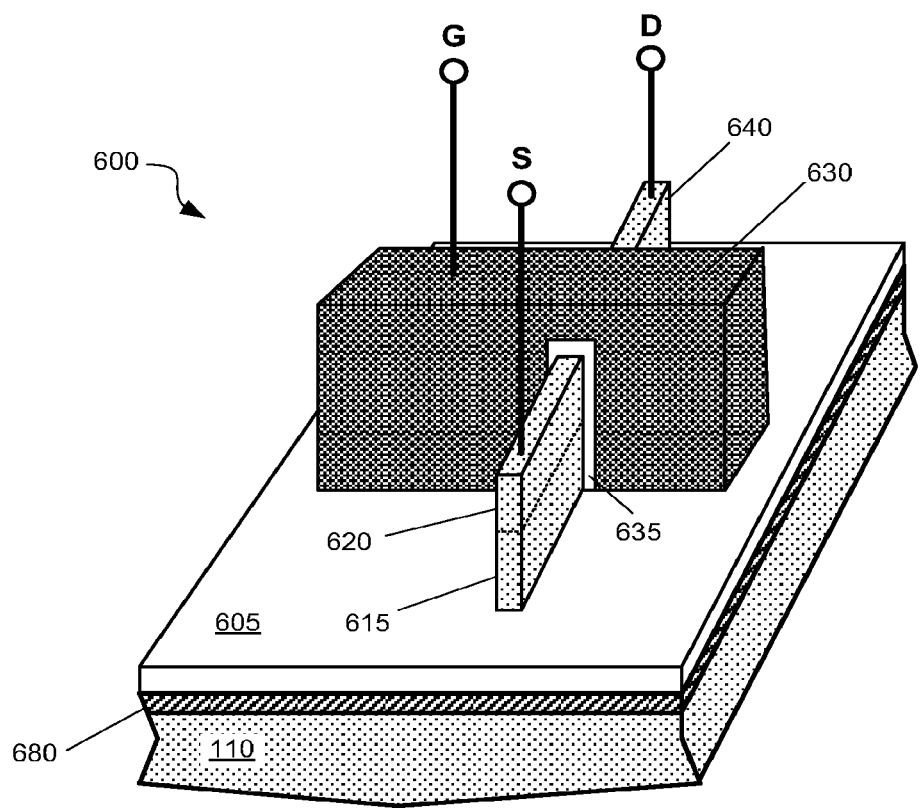
FIG. 6 depicts a strained-channel finFET, according to some embodiments.

FIG. 6 depicts an embodiment of a strained-channel finFET. In some implementations, a fin 615 or array of fins may be formed (e.g., patterned and etched) from a semiconductor layer 312 that is formed over an insulating layer 605. With an underlying insulator 605, the fin 215 may be fully insulated from the underlying substrate 110 and strain-inducing layer 680. For finFET devices, the thicknesses of the strain-inducing layer 680 and semiconductor layer may be increased to values greater than those used for FD-SOI FETs. For example, the semiconductor layer 312 may have a thickness between 30 nm and about 150 nm, in some embodiments.

The fin 215 may be formed using any suitable lithographic process, e.g., a sidewall image transfer process. After formation of the fin, the strain-inducing layer 680 may be cut, as described above in connection with FIGS. 4B-1-4B-3 to relieve strain uniaxially in the strain-inducing layer and induce strain along the length of the fin. For example, the fin 215 may be oriented along the Y direction shown in FIG. 4B-3, and strain may be induced along the length of the fin. Gate structures that comprise a gate conductor 630 and gate insulator 635 may be formed over the fin prior to, or after, stain relief of the strain-inducing layer 680.

The described methods of forming strained channel devices may be employed for CMOS circuits. In a CMOS circuit, there will be transistors of two types: n-channel type and p-channel type. Since a strain-inducing layer 380 may induce only one type of strain in an adjacent transistor's channel region, transistors of a first type (e.g., n-channel MOS) may benefit from increased electron mobility in the channel due to the strain, whereas transistors of a second type (e.g., p-channel MOS) may incur decreased mobility and degraded transistor performance because the channel strain is of the wrong type. For example, a strain-inducing layer 380 that generates tensile strain in channel regions may benefit n-channel, Si-based FETs, because the electron mobility increases under tensile strain. However, hole mobility decreases under tensile strain, so p-channel FETs would incur reduced performance. The described methods of forming strained channel devices can accommodate both types of FETs, such that performance of one type of FET may be improved while the performance of the other type of FET may not be degraded substantially.

Trench isolation structures, 372, 374 may be used to control strain locally and/or to electrically isolate one or more FETs. For example, trench isolation structures 372 may be formed to induce stress locally in the semiconductor layer 312 (by strain relief of the strain-inducing layer 380), and to electrically isolate a region of the semiconductor layer 312. Alternatively, trench isolation structures 374 may be formed to electrically isolate a region of the semiconductor layer 312 without providing stress-relief of the strain-inducing layer 380.

By controlling the etch depth and patterns for the trench isolation structures, some regions of the semiconductor layer 312 may not be strained, or may have low strain values (e.g., less than about 100 MPa), and other regions may have appreciable strain. According to some embodiments, there may be one or more FETs in an area that is not bounded by stress-relief cuts, adjacent to a stress-relief cut, or in an area sufficiently distant from a stress-relief cut such that there is low or no strain in the semiconductor layer 312 at the location of the FET. Therefore, FETs having no strain in their channel regions may be formed on the same substrate 110, but in an area separated from an area in which the semiconductor layer 312 is strained.

Having strained and unstrained regions of semiconductor layer 312 can be advantageous for CMOS FET circuitry. For example, a first type of FET that benefits from increased carrier mobility may be located in a region where the semiconductor layer 312 is strained due to nearby stress-relief cuts 372. A second type of FET may be located in a different region where the semiconductor layer 312 is not strained (e.g., at a region not bounded by stress-relief cuts, adjacent to a relief cut, or sufficiently removed from a relief cut). Such localized strain control (as determined by relief-cut patterns) can enhance mobility of carriers in a first type of FET without degrading mobility of carriers in a second opposite type of FET formed on the same substrate.

Figure 7A:
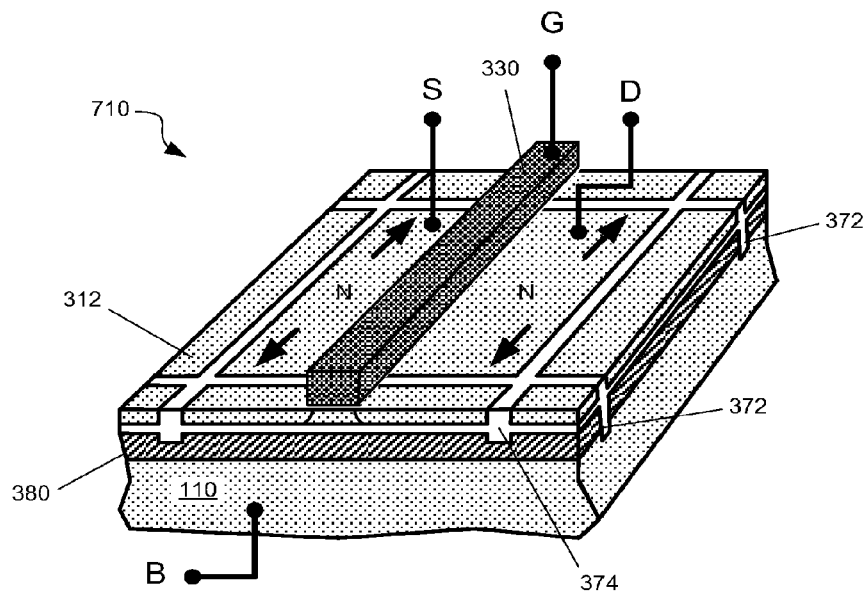
FIGS. 7A-7B depict an embodiment in which a first portion of a substrate may include at least one strained-channel FET of a first type and a second portion of the same substrate may include at least one FET having a channel region substantially free of strain.
Figure 7B:
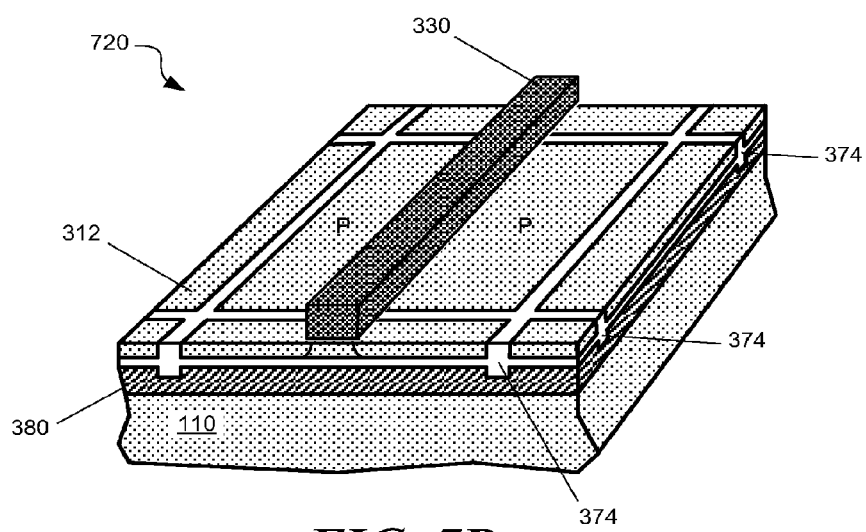

FIGS. 7A-7B depict an embodiment in which a first type of FET (n-channel, FIG. 7A) has a strained channel region that increases the electron mobility and the second type of FET (p-channel, FIG. 7B) has an unstrained channel region that does not alter the electron mobility for the device. Both devices are electrically isolated by trench isolation structures, and may be fabricated on a same substrate.

In FIG. 7A, a region of a substrate 110 may include trench isolation structures 372 that have been formed by etching through the strain-inducing layer 380. Accordingly, at this region of the substrate, the relief of stress in the strain-inducing layer induces strain in the adjacent semiconductor layer 312. For the embodiment depicted, the strain-inducing layer 380 may comprise SiGe and the substrate 110 and semiconducting layer 312 may be Si. The resulting tensile strain in the semiconductor layer can improve electron mobility in the channel region of the transistor.

At a different region of the same substrate, the trench isolation structures 374 are formed without etching through the strain-inducing layer 380, as depicted in FIG. 7B. Accordingly, there is no relief of strain in the strain-inducing layer and no generation of strain in the semiconductor layer 312. At this region of the substrate, p-channel FETs may be formed. Because the channel region is not strained, there will be no degradation in hole mobility for the FETs formed in the unstrained region of the substrate.

In some embodiments, different strain-inducing layers having different chemical compositions may be formed at different regions of the substrate. For example, in a first region of a Si substrate 110, a first strain-inducing layer comprising SiGe may be formed. In a second region of the substrate, a second strain-inducing layer comprising SiC may be formed. The first region may be used to form strained-channel FETs of a first channel conductivity type, e.g., n-channel, and the second region may be used to form strained-channel FETs of a second channel conductivity type, e.g., p-channel. Carrier mobility may then be improved for both types of FETs. It will be appreciated that other material combinations can be used in other embodiments.

FIG. 7A depicts circuitry for biasing the FET's gate, source, drain, and back body region. Bias circuitry may be formed by any suitable means, and may include conductive traces and contact pads, though is not limited to only these elements. In some embodiments, gate conductors for multiple electrically-insulated regions may share a common bias, as depicted in the drawing. In another embodiment, a gate conductor may only provide control to one region and be electrically insulated from gate conductors in adjacent regions. A back body bias may be shared by multiple electrically-insulated regions, in some embodiments.

Referring again to FIG. 4B-3 and FIG. 4C-3 it will be appreciated that the etch depths of trenches or relief cuts used relieve stress in the strain-inducing layer 380 and to form isolation trench structures can determine a type and amount of strain induced in the channel regions. The type of strain induced can be varied from uniaxial (as depicted in FIG. 4B-3) to biaxial (as depicted in FIG. 4C-3) or radial (e.g., if the trenches are patterned in a circle around an active area). An amount of induced strain may be determined by a depth of the stress-relief cuts, according to some embodiments. For example, where there is no etching into the strain-inducing layer 380, there may be no strain relief and no induced stress in the semiconductor layer 312. As the etch depth increases into the strain-inducing layer, the amount of strain induced in the semiconductor layer 312 may increase to a saturation value. The saturation value for the amount of strain induced in the semiconductor layer 312 may occur at an etch depth that is approximately equal to or greater than the thickness of the strain-inducing layer 380.

According to some embodiments, the orientation of the stress-relief cuts or trenches may be selected with respect to the semiconductor layer's 312 crystallographic orientation, so as to improve carrier mobility. For a given semiconductor, carrier mobility may be increased to higher values when strain is directed along one crystallographic orientation as compared to another crystallographic orientation. For example, mobility enhancements are higher for strain directed along preferred crystal axes. Accordingly, a semiconductor may have a preferred strain direction (for uniaxial strain) or orientation (for multi-axial strain) that provides a higher mobility enhancement than other strain directions or orientations. According to some embodiments, a semiconductor may have a preferred axial strain type (e.g., uniaxial, biaxial, radial, etc.) that provides a higher mobility enhancement than other strain types. A device may be fabricated such that it takes advantage of a preferred strain direction or orientation and/or a preferred strain type. For example, stress-relief cuts or trenches may be oriented so as to induce strain in a channel region of a transistor in a preferred strain direction or orientation and/or of a preferred strain type.

In some implementations, the dimensions of device active areas (width W and active area length $S_a$) may be selected to control the type and/or amount of strain induced in a channel region of a transistor formed in the active area. For example and referring again to FIG. 4B-3, the strain in the active area may be substantially uniform, uniaxial strain when the width W of the active area is below a critical width $W_c$ (i.e., $W<W_c$) irrespective of the length $S_a$ of the active area. The value of $W_c$ may be determined by experimentation or numerical simulation. The term "substantially uniform" means that the strain in the active area may vary in magnitude less than about 5% in some embodiments, less than about 10% in some embodiments, less than about 20% in some embodiments, and yet less than about 30% in some embodiments. For $W>W_c$, the magnitude of the induced strain may vary appreciably over the active area.

For cases where W is sufficiently large, the majority of induced strain may appear near the Y-directed edges of the active region, and there may be little or no induced strain near the center of the active area. For regions in which W is significantly greater than $W_c$, transistors of a first type (e.g., n-channel) may be formed near the edges of the active area, and transistors of a second type (e.g., p-channel) may be formed near the center of the active area. Arrangements of transistors in this manner can improve carrier mobility for the first type of transistor without appreciably degrading carrier mobility for the second type of transistor.

Similar aspects occur for the embodiment depicted in FIG. 4C-3. According to some embodiments, if $W<W_c$ and $S_a<S_{ac}$ (where $S_{ac}$ is a critical length and may be determined from experimentation or numerical simulation), then there may be substantially uniform biaxial strain induced across the active area. For $W<W_c$ and $S_a>S_{ac}$ there may be substantially uniform uniaxial strain in the Y direction over a majority of the active area. Conversely, if $W>W_c$ and $S_a<S_{ac}$ there may be substantially uniform uniaxial strain in the X direction over a majority of the active area. If $W>W_c$ and $S_a>S_{ac}$ there may be little or no induced strain at the center of the active region, biaxial strain at the corners of the active region, and uniaxial strain (X directed and Y directed) along the edges of the active region. In some embodiments, the dimensions of the active region are selected to determine a type or types of axial strain within the active region. An advantage of selecting active region dimensions, is that a single patterning step and single etching process is needed for the relief cuts or trench isolation structures, whereas at least a second etching step and additional etching process would be required to produce two trench depths depicted in FIGS. 3A-3B.

The values of $W_c$ and $S_{ac}$ may depend upon a so-called "critical dimension" for the microfabrication processes. For example, at a 10 nm technology node, the value of $W_c$ may be around 200 nm and the value of $S_{ac}$ may be around 250 nm. In other embodiments, the values for $W_c$ and $S_{ac}$ may be about 4 and 5 times, respectively, the combined thickness of the strain-inducing layer 380, the insulating layer 305, and the semiconductor layer 312, for example. According to some embodiments, the value for $W_c$ may be between about 3 and about 5 times the combined thickness of the strain-inducing layer 380, the insulating layer 305, and the semiconductor layer 312. According to some embodiments, the value for $S_{ac}$ may be between about 4 and about 6 times the combined thickness of the strain-inducing layer 380, the insulating layer 305, and the semiconductor layer 312.

Variations of the embodiments are possible. In some embodiments, some stress-relief cuts (e.g., etched trenches) may not be filled with insulating material. In some implementations, some etched trenches may not be filled with any material. In some implementations, some etched trenches may be filled with a conductor.

The methods of inducing strain in a semiconductor layer described above may be combined with other methods of inducing strain to further increase strain. For example, a strained semiconductor structure may be formed on the first semiconductor layer 312 (e.g., by epitaxy of lattice-mismatched semiconductors) before the stress-relief cuts in the strain-inducing layer 380 are formed. Subsequent formation of the stress-relief cuts may further increase the strain of the strained semiconductor structure.

According to some embodiments, the methods of inducing strain in a semiconductor layer described above may be combined with methods described in U.S. patent application Ser. No. 13/953,551 filed Jul. 29, 2013, or U.S. patent application Ser. No. 14/027,758 filed Sep. 16, 2013, which are incorporated by reference in their entirety. For example, a second strain-inducing layer may be formed adjacent the semiconductor layer 312. The second strain-inducing layer may be lattice-mismatched to the semiconductor layer 312. A second semiconductor layer that is lattice-mismatched to the second strain-inducing layer may be epitaxially grown on the second strain-inducing layer, and finFETs may be formed in the second semiconductor layer.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips. For example, transistors such as those depicted in any of FIGS. 3B, 4F-3, 5, 7A, and 7B, may be incorporated in electronic devices.

Although some methods and structures above are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around transistors.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. A method, comprising:
   forming a strain-inducing layer on a substrate;
   forming a semiconductor layer having a first surface on the strain-inducing layer and a second surface opposite the first surface, the semiconductor layer including a source region, a drain region, and a channel region of a semiconductor device; and forming at least one stress-relief trench that extends through the semiconductor layer and into the strain-inducing layer, the trench abuts side surfaces of the source region, the drain region, and the channel region, which side surfaces extend between the first and second surfaces of the semiconductor layer, and the trench imparts strain to the channel region.

2. The method of claim 1 wherein forming the semiconductor layer includes forming a semiconductor fin including the source region, the drain region, and the channel region.

3. The method of claim 1 wherein the strain-inducing layer comprises a first semiconductor material, and the substrate comprises a second semiconductor material that is different from the first semiconductor material.

4. The method of claim 1, further comprising forming an insulating layer between the strain-inducing layer and the source region, the drain region, and the channel region of the semiconductor layer.

5. The method of claim 1 wherein forming the at least one stress-relief trench includes:
forming a first plurality of trenches extending in a first lateral direction; and
forming a second plurality of trenches extending in a second lateral direction that is transverse to the first lateral direction.

6. The method of claim 5 wherein forming the first plurality of trenches includes forming the first plurality of trenches through the strain-inducing layer and at least partially into the substrate.

7. A method, comprising:
forming a strain-inducing layer on a silicon-on-insulator (SOI) substrate, the strain-inducing layer extending over an area of the substrate;
forming an insulating layer on the strain-inducing layer;
forming a semiconductor layer extending over the area of the substrate, the semiconductor layer including a source region, a channel region, and a drain region, the insulating layer being between the strain-inducing layer and the source region, the channel region, and the drain region of the semiconductor layer
forming stress-relief trenches in the strain-inducing layer to relieve stress in the strain-inducing layer and impart strain to at least one active area for at least one field effect transistor (FET) formed in the semiconductor layer.

8. The method of claim 7, further comprising:
forming a gate structure in the at least one active area.

9. The method of claim 7 wherein the source, channel, and drain regions are formed in the semiconductor layer, wherein the semiconductor layer is ultrathin and is disposed on an ultrathin buried oxide layer.

10. The method of claim 9 further comprising forming at least one epitaxial region on the drain and source regions that adds strain to the channel region in addition to strain induced in the channel region by the strain-inducing layer.

11. The method of claim 9, further comprising forming bias circuitry for applying a bias voltage to the substrate as a back gate or body bias.

12. The method of claim 7, further comprising:
forming at least one semiconductor fin in the semiconductor layer;
forming a gate structure over the at least one fin; and
forming the source, drain, and channel regions in the semiconductor fin.

13. The method of claim 7 wherein the strain-inducing layer comprises at least one of SiGe or SiC and the source, drain, and channel regions are formed of Si.

14. The method of claim 7 wherein forming the stress-relief trenches comprises:
forming a first plurality of trenches extending in a first lateral direction; and
forming a second plurality of trenches extending in a second lateral direction that is different from the first lateral direction.

15. The method of claim 14, further comprising filling the first plurality of trenches and the second plurality of trenches with an insulating material.

16. The method of claim 14 wherein forming the first plurality of trenches includes etching the first plurality of trenches through the strain-inducing layer.

17. The method of claim 7, further comprising:
forming the stress-relief trenches to define a first active area of the at least one active area, the first active area having a width W and a length $S_a$; and
forming source, drain, and channel regions in the first active area.

18. A method, comprising:
forming a strain-inducing layer on a silicon-on-insulator (SOI) substrate, the strain-inducing layer extending over an area of the substrate;
forming a semiconductor layer extending over the area of the substrate and adjacent the strain-inducing layer;
forming stress-relief trenches in the strain-inducing layer to relieve stress in the strain-inducing layer and impart strain to at least one active area for at least one field effect transistor (FET) formed in the semiconductor layer;
forming the stress-relief trenches to define a first active area of the at least one active area, the first active area having a width W and a length $S_a$; and
forming source, drain, and channel regions in the first active area,
wherein the length $S_a$ is formed to be greater than four times a total thickness of the strain-inducing layer, the semiconductor layer, and an insulating layer between the strain-inducing layer and the semiconductor layer.

19. A method, comprising:
forming at least one strained-channel field effect transistor (FET) on a substrate, the forming including:
forming a strain-inducing layer on an area of the substrate;
forming an insulating layer on the strain-inducing layer;
forming a semiconductor layer extending on the area of the substrate, the semiconductor layer including a source region, a channel region, and a drain region, the insulating layer being between the strain-inducing layer and the source region, the channel region, and the drain region of the semiconductor layer; and
forming a plurality of stress-relief trenches in the strain-inducing layer, the stress-relief trenches abutting side surfaces of the source region, the drain region, and the channel region of the semiconductor layer.

20. The method of claim 19, further comprising relieving stress in the strain-inducing layer and imparting strain to at least the channel region of the semiconductor layer.

21. The method of claim 20, further comprising:
forming a gate structure on the channel region.

22. The method of claim 19, further comprising:
forming at least one semiconductor fin in the semiconductor layer;
forming a gate structure over the at least one fin; and forming the source, drain, and channel regions in the semiconductor fin.

23. The method of claim 19 wherein forming the stress-relief trenches includes:
   forming a first plurality of isolating trenches extending in a first direction; and
   forming a second plurality of isolating trenches extending in a second direction that is different from the first direction.

24. The method of claim 18, further comprising:
   forming an insulating layer between the strain-inducing layer and the semiconductor layer.

\* \* \* \* \*